United States Patent

Sedlak

[11] Patent Number: 5,963,478
[45] Date of Patent: Oct. 5, 1999

[54] EEPROM AND METHOD OF DRIVING THE SAME

[75] Inventor: Holger Sedlak, München, Germany

[73] Assignee: Siemens Aktiengesellschaft, Munich, Germany

[*] Notice: This patent is subject to a terminal disclaimer.

[21] Appl. No.: 08/907,211

[22] Filed: Aug. 6, 1997

Related U.S. Application Data

[63] Continuation of application No. PCT/DE96/02239, Nov. 21, 1996.

[30] Foreign Application Priority Data

Dec. 6, 1995 [DE] Germany .......................... 195 45 523

[51] Int. Cl.$^6$ .................................................. G11C 16/02
[52] U.S. Cl. .......................... 365/185.29; 365/185.11; 365/185.18; 365/218
[58] Field of Search .................... 365/185.11, 185.18, 365/185.29, 218

[56] References Cited

U.S. PATENT DOCUMENTS

| | | | |
|---|---|---|---|
| 5,033,023 | 7/1991 | Hsia et al. .............................. | 365/185 |
| 5,065,364 | 11/1991 | Atwood et al. ......................... | 365/185 |
| 5,745,417 | 4/1998 | Kobayashi et al. ................. | 365/185.29 |

FOREIGN PATENT DOCUMENTS

| | | |
|---|---|---|
| 0 387 889 A2 | 9/1990 | European Pat. Off. . |
| 0 637 035 A1 | 2/1995 | European Pat. Off. . |
| 42 33 248 A1 | 5/1993 | Germany . |
| 5-28781 | 2/1993 | Japan . |

*Primary Examiner*—Do Hyun Yoo
*Attorney, Agent, or Firm*—Herbert L. Lerner; Laurence A. Greenberg

[57] ABSTRACT

An EEPROM includes a multiplicity of memory cells which are disposed in a memory cell array and can be addressed through the use of word, bit and source lines for writing, reading out and erasing. The memory cells which can be addressed through a single word line are divided into a multiplicity of groups, of which each is assigned a separate common source line. A method of driving the EEPROM carries out a group-by-group writing to, reading from and/or erasing of the memory cells which can be addressed through a single word line.

7 Claims, 3 Drawing Sheets

EEPROM AND METHOD OF DRIVING THE SAME

CROSS-REFERENCE TO RELATED APPLICATIONS

This application is a continuation of International Application Serial No. PCT/DE96/02239, filed Nov. 21, 1996.

BACKGROUND OF THE INVENTION

1. Field of the Invention

The present invention relates to an EEPROM having a multiplicity of memory cells which are disposed in a memory cell array and can be addressed by word, bit and source lines for writing, reading out and erasing. The present invention also relates to a method of driving an EEPROM.

EEPROMs and methods of driving the same for writing in, reading out and erasing data have long been known and are used to an increasing extent.

A practical example of the structural layout and driving of a conventional EEPROM is explained below with reference to FIGS. 2 and 3.

The conventional EEPROM which is described has a multiplicity of memory cells that are disposed in a memory cell array and can be addressed through the use of respective word, bit and source lines.

EEPROMs constructed in such a way are increasingly used in chip cards having a memory content which has to be updated on specific occasions to correspond to changes that have occurred in the meantime (for example the charge meter of a phone card).

Such updates require an erasing and subsequent overwriting of memory areas of the EPROM.

The effort required therefor is disproportionately great, in particular in the very frequent case in which only small amounts of data have to be updated and, unless additional security precautions are taken, it cannot entirely be ruled out that, under certain circumstances, the desired update is not executed properly if there is an unfortunate coincidence of rare exceptional conditions.

SUMMARY OF THE INVENTION

It is accordingly an object of the invention to provide an EEPROM and a method of driving the same, which overcome the hereinafore-mentioned disadvantages of the heretofore-known devices and methods of this general type in such a way that updating of stored data can always be carried out simply, reasonably quickly and to the greatest extent without being susceptible to errors.

With the foregoing and other objects in view there is provided, in accordance with the invention, an EEPROM, comprising a multiplicity of memory cells disposed in a memory cell array; and word, bit and source lines for addressing the memory cells for writing, reading out and erasing; the memory cells to be addressed through a single one of the word lines being divided into a multiplicity of groups, and each of the groups being associated with a separate common one of the source lines.

In accordance with another feature of the invention, each of the word lines includes a selection line and a control line.

In accordance with a further feature of the invention, each of the memory cells includes a selection transistor and a memory transistor having interconnected drain portions.

In accordance with an added feature of the invention, each of the selection transistors has a gate portion connected to one of the selection lines.

In accordance with an additional feature of the invention, each of the selection transistors has a source portion connected to one of the bit lines.

In accordance with yet another feature of the invention, each of the memory transistors has a control gate portion connected to one of the control lines.

In accordance with yet a further feature of the invention, each of the memory transistors has a source portion connected to one of the source lines.

In accordance with yet an added feature of the invention, the memory cells disposed in the same row of the memory cell array are each connected to the same selection and control lines.

In accordance with yet an additional feature of the invention, the memory cells disposed in the same column of the memory cell array are each connected to the same bit line.

In accordance with still another feature of the invention, the memory cells disposed in the same column of the memory cell array are each connected to the same source line.

In accordance with still a further feature of the invention, the memory cells include a memory cell for storing a data bit.

In accordance with still an added feature of the invention, the memory cell groups include a memory cell group for storing a data word including any desired number of data bits.

In accordance with still an additional feature of the invention, the data word is a data byte.

In accordance with again another feature of the invention, the memory cells of a memory cell group are distributed as desired over a row of the memory cell array.

In accordance with again a further feature of the invention, the memory cell groups of a row of the memory cell array are of the same size or different sizes.

With the objects of the invention in view there is also provided a method of driving an EEPROM having a multiplicity of memory cells disposed in a memory cell array, and word, bit and source lines for addressing the memory cells for writing, reading out and erasing, which comprises dividing the memory cells to be addressed through a single one of the word lines into a multiplicity of groups each associated with a separate common one of the source lines; and groupwise writing to, reading from and/or erasing the memory cells to be addressed through a single word line.

In accordance with another mode of the invention, there is provided a method which comprises handling a plurality of the memory cell groups as a common group.

In accordance with a further mode of the invention, there is provided a method which comprises dividing each of the word lines into a selection line and a control line, erasing data of a memory cell group by applying substantially 0 V to the respective bit lines of the memory cell group to be erased, and applying a high voltage to the selection line and the control line concerned.

In accordance with an added mode of the invention, there is provided a method which comprises connecting the source line of a memory cell group to be erased substantially to earth.

In accordance with an additional mode of the invention, there is provided a method which comprises ensuring non-erasing of data of memory cell groups not to be erased by applying a high voltage to the bit lines of the memory cell group not to be erased.

In accordance with yet another mode of the invention, there is provided a method which comprises keeping the source line of a memory cell group not to be erased floating.

In accordance with yet a further mode of the invention, there is provided a method which comprises at first gradually increasing a required high voltage to be applied to respective signal lines of a memory cell group to a set value, once the high voltage has been applied, in particular for selective erasing.

In accordance with a concomitant mode of the invention, there is provided a method which comprises increasing the high voltage in step and/or ramp form.

These measures make it possible to restrict a writing in, reading out and, in particular, also erasing of data selectively to quite specific data which until now was not possible due to the provision of only a single common source line for all of the memory cells of the memory cell array, at least in the case of erasing (erasing could only be performed row by row).

The updating of data, which takes place by an erasing of the data to be updated and subsequent overwriting by the updated data, can consequently be carried out with exclusive access to the data to be updated.

In other words, in contrast to the steps which until now have had to be carried out for the updating of data, namely:

(1) complete re-storing of the content of the memory cells (row of the memory cell array) which can be addressed by a word line, (2) erasing of the data stored in the row of the memory cell array, and (3) writing back of the data not to be updated and new writing of the data to be updated into the erased row of the memory cell array, by providing the measures according to the invention it is possible to dispense with a re-storing, erasing and writing back of the data not to be updated.

For example, dispensing with those additional operations reliably prevents data which are temporarily erased during an interruption in the power supply (data set to a predetermined erased value such as "0000 . . . " or "1111 . . . ") from remaining in the EEPROM instead of data not to be updated.

Due to the reduced number of reading, writing and erasing operations, the updating of data can, in addition, be carried out more quickly and with less use of energy.

Furthermore, the reduced number of writing operations increases the service life of the memory cells, which can only withstand a restricted number of writing operations (endurance).

Other features which are considered as characteristic for the invention are set forth in the appended claims.

Although the invention is illustrated and described herein as embodied in an EEPROM and a method of driving the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
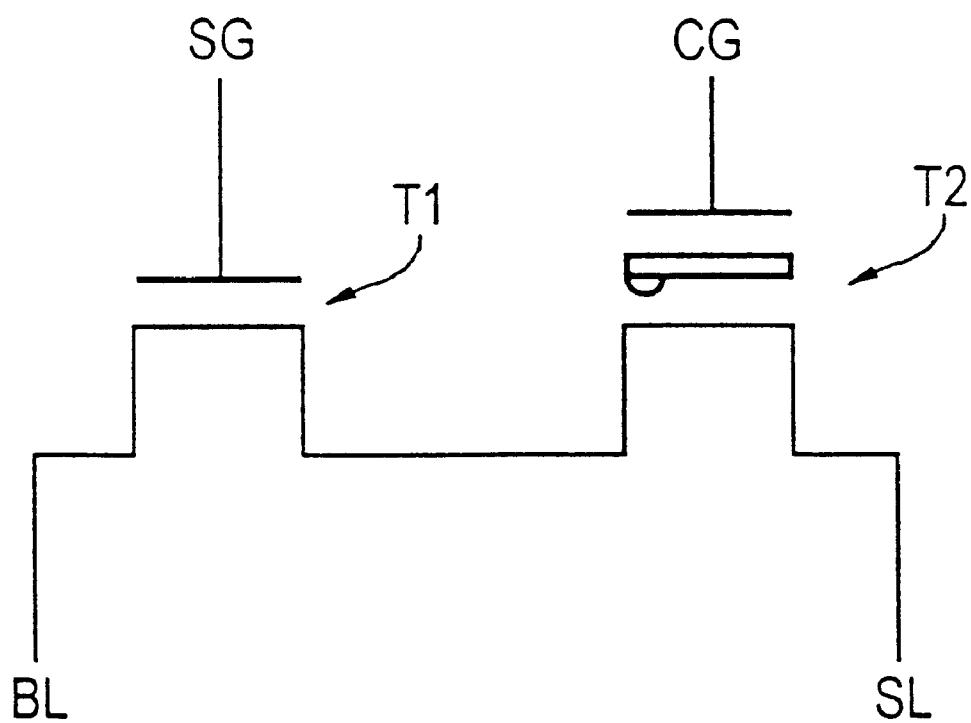
FIG. 2 is a schematic diagram of the structural layout of an EEPROM memory cell.

Referring now to the figures of the drawings in detail and first, particularly, to FIG. 2 thereof, there is seen an exemplary structural layout of an individual memory cell for storing an individual data bit.

The memory cell shown in FIG. 2 has a selection transistor T1 and a memory transistor T2.

The selection transistor T1 is a "normal" field-effect transistor, the mode of operation and function of which are known and do not require any further explanation.

The memory transistor T2 is a floating (connectionless) gate field-effect transistor which has tunnel windows and the mode of operation and function of which are likewise known, due to their widespread use in EEPROM memory cells, and consequently also do not require any further explanation.

The selection transistor T1 has a source portion connected to a bit line BL, a gate portion connected to a selection line SG and a drain portion connected to a drain portion of the memory transistor T2.

The memory transistor T2 has a source portion connected to a source line SL, a control gate portion connected to a control line CG, and the drain portion connected to the drain portion of the selection transistor T1.

The selection line SG and the control line CG together form a so-called word line WL.

The signal lines mentioned above lead to reading, erasing and writing of the following signals $U_{pp}$ which are at a high voltage of, for example, about 15 V to 20 V:

|  | BL | SG | CG |
| --- | --- | --- | --- |
| Reading | ≈4 V | 5 V | ≈1.2 V |
| Erasing | 0 V | $U_{pp}$ | $U_{pp}$ |
| Writing | $U_{pp}$/0 V | $U_{pp}$ | 0 V |

The memory cell shown in FIG. 2 can make up a memory cell array, if an appropriate number of memory cells is provided.

Figure 3:
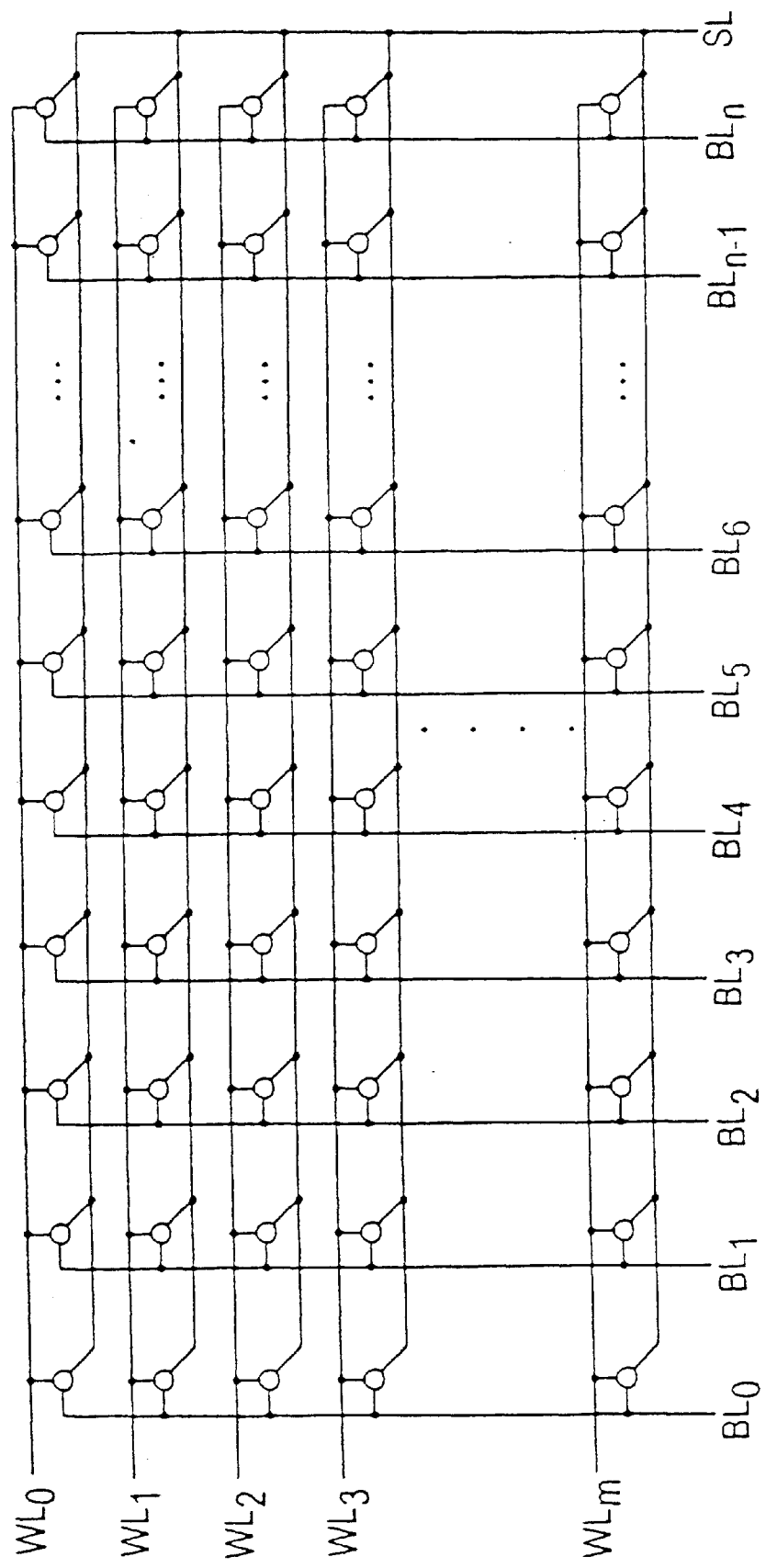
FIG. 3 is a schematic diagram of the structural layout of a conventional EEPROM memory cell array.

The structural layout of such a memory cell array is represented in FIG. 3.

FIG. 3 is a schematic representation of a memory cell array of a conventional EEPROM.

The illustrated memory cell array has a multiplicity of individual memory cells according to FIG. 2, which are disposed in a plurality m+1 of rows and a plurality n+1 of columns. Each memory cell is identified by a symbol "O".

The n+1 elements of each row of the memory cell array in each case are connected to a common word line $WL_0$, $WL_1$ . . . $WL_m$ (in each case including a selection line SG and a control line CG). The m+1 elements of each column of the memory cell array in each case are connected to a common bit line $BL_0$, $BL_1$ . . . $BL_n$. The source lines SL of all of the memory cells of the memory cell array are combined to form a common source line.

The interconnection of the memory cells to form the memory cell array constructed in a matrix-like manner shown in FIG. 3 makes it possible to address the memory cells individually when writing in and reading out data) or row by row (when rasing data) by correspondingly driving the word, bit and source lines.

EEPROMs that are constructed in such a way are increasingly used in chip cards hating a memory content which has to be updated on specific occasions to correspond to changes which have occurred in the meantime (for example the charge meter of a phone card).

Such updates require an erasing and subsequent overwriting of memory areas of the EPROM.

The effort required therefor is disproportionately great, in particular in the very frequent case in which only small amounts of data have to be updated. Furthermore, unless additional security precautions are taken, it cannot be entirely ruled out that, under certain circumstances, the desired update is not executed properly if there is an unfortunate coincidence of rare exceptional conditions.

Figure 1:
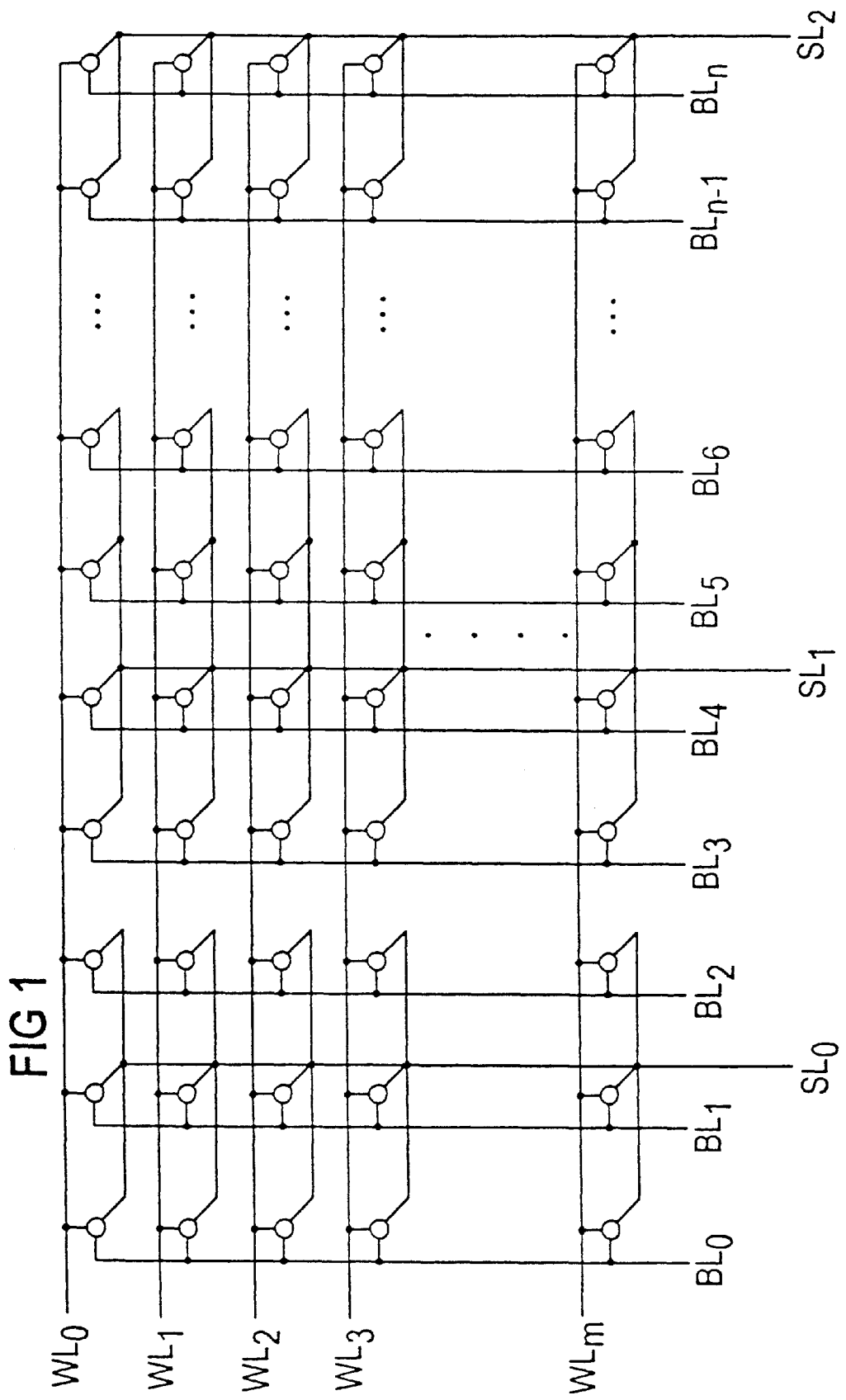
FIG. 1 is a schematic diagram of an exemplary embodiment of the structural layout of the memory cell array of an EEPROM constructed according to the invention.

Like the conventional memory cell array shown in FIG. 3, the memory cell array shown in FIG. 1 includes a multiplicity of conventional memory cells, in each case identified by the symbol "O", (for example memory cells of the type shown in FIG. 2), which are disposed in a multiplicity (m+1) of rows and a multiplicity (n+1) of columns.

The n+1 elements of each row of the memory cell array in each case are connected to a common word line $WL_0$, $WL_1$ ... $WL_m$ (in each case including a selection line SG and a control line CG). The m+1 elements of each column of the memory cell array in each case are connected to a common bit line $BL_o$, $BL_1$, ... $BL_n$.

However, in contrast to the conventional memory cell array shown in FIG. 3, the source lines of the memory cells are no longer combined to form a common source line for all of the memory cells of the memory cell array.

Rather, any desired multiplicity of separate source lines SL are provided (in FIG. 1, source lines $SL_o$, $SL_1$ and $SL_2$ are shown by way of example), of which each is assigned a specific group of memory cells within a row of the memory cell array. Expressed in another way, the memory cells of a row of the memory cell array are divided up into a plurality of groups, of which each has a source line that is separate, but common to the memory cells of a respective group.

As a rule, in practice a memory cell group contains as many memory cells as a data word (for example one byte) has bits, and a multiplicity of such identical memory cell groups are provided next to one another (in series alongside one another) per row of the memory cell array.

In general terms, however, according to requirements, each row of the memory cell array may have any desired multiplicity of groups (at least two) which may be of the same size or of different sizes, may include any desired number of memory cells (at least one), and the individual elements or memory cells of which may be distributed as desired over the row of the memory cell array.

One of the resulting possibilities departing from the "as a rule" case mentioned above, is to combine the memory cells of each $x^{th}$ data word within a row of the memory cell array to form a group (in order to be able, for example, to change altogether the display attributes assigned to each character of a text to be displayed).

In the representation of FIG. 1, three memory cell groups are illustrated. The first group (on the left according to FIG. 1) includes three memory cells lying next to one another, having source lines which are combined to form a separate common source line SL. The second group (in the middle according to FIG. 1), which adjoins the first group, includes four memory cells lying next to one another, having source lines which are combined to form a separate common source line $SL_1$. The third group (on the right according to FIG. 1) includes two memory cells lying next to each other, having source lines which are combined to form a separate common source line $SL_2$.

In the illustrated exemplary embodiment, the group division is the same for all of the rows of the memory cell array. The respective common source lines of the mutually corresponding groups in various rows of the memory cell array are connected to one another. Although such a structural layout limits the outlay required to realize the memory cell array, it is of course not obligatory.

Rather, each row of the memory cell array may be subdivided as desired, entirely independently of the other rows, and the source lines of the respective groups may be laid and driven entirely independently of one another.

The above-described structure of the EEPROM memory cell array makes possible (using a corresponding control device) a group-by-group writing to, reading from and/or erasing of the memory cells which can be addressed through a single word line, wherein it is possible, as already indicated above, in an extreme case for a group to even include only a single memory cell.

The individual memory cells of the EEPROM memory cells can consequently be addressed selectively in any desired number and distribution for the writing in, reading out and erasing of data.

This has advantageous effects in particular in the erasing of data and in the updating (=erasing+new writing in) of data since, in the case of conventional memory cell arrays, erasing was only possible in units (under certain circumstances very large units) of rows of memory cell arrays, as already mentioned at the beginning.

A selective erasing of an individual group within a row of a memory cell array is performed by 0 V being applied to the bit line(s) BL of the memory cells of the group to be erased, and by a high voltage of, for example, +15 to +20 V being applied in each case to the selection line SG and the control line CG of the group concerned.

A non-erasing of the remaining group within the row concerned of the memory cell array takes place by likewise applying a high voltage of, for example, +15 to +20 V to the bit line(s) BL of the memory cells of the group(s) not to be erased, with the conditions otherwise being identical.

The respective source lines of the memory cell groups in this case are kept selectively in the floating (not actively driven) state (if, as in the case of non-erasing, an actively driven high voltage is applied to the assigned bit lines) or are connected to earth or ground (in all other cases).

The operations during the writing in and reading out of data do not require any adaptation of the EEPROM structural layout according to the invention. Nevertheless, the novel structural layout opens up possibilities of also modifying these operations in an advantageous way.

In order to reliably prevent the application of high voltage to the various signal lines from causing a charge accumulation in the memory cells, possibly leading to a changing of the data, it may be provided that the high voltage not be applied immediately at the full level, but instead be applied so as to only increase gradually (step by step and/or in ramp form) to the set value.

I claim:

1. A method of erasing data from an EEPROM having a plurality of individually addressable memory cell groups, each of the memory cell groups being associated with a plurality of signal lines including a word line, a source line, and at least one bit line, each word line including a selection line and a control line, the method comprising erasing data by applying a first voltage to at least one of the associated signal lines of a memory cell group having data to be erased, applying a low voltage having a value of substantially 0 V to the associated at least one bit line and applying said first voltage to the associated selection line and the associated control line of the memory cell group having data to be erased, and increasing said first voltage to a high value.

2. The method according to claim 1, which further comprises applying a low voltage having a value of substantially 0 V to the associated source line of the memory cell group having data to be erased.

3. The method according to claim 1, which comprises ensuring non-erasing of data from memory cell groups having data not to be erased by applying a high voltage to the at least one bit lines of the memory cell groups having data not to be erased.

4. The method according to claim 3, which comprises keeping the source lines of the memory cell groups having data not to be erased floating.

5. The method according to claim 1, which comprises gradually increasing said first voltage in step form.

6. The method according to claim 1, which comprises gradually increasing said first voltage in ramp form.

7. The method according to claim 1, wherein the increasing step comprises gradually increasing the first voltage to a high value.

* * * * *